「(12) United States Patent
D'Abramo et al.

(10) Patent No.: US 9,537,298 B2
(45) Date of Patent: Jan. 3, 2017

(54) ELECTRONIC MODULE, ELECTRONIC ARRANGEMENT AND METHOD FOR PRODUCING AN ELECTRONIC MODULE

(75) Inventors: Paolo D'Abramo, Civitavecchia (IT); Luigi Di Piro, Ponsacco (IT)

(73) Assignee: AMS AG, Unterpremstaetten (AT)

( * ) Notice: Subject to any disclaimer, the term of this patent is extended or adjusted under 35 U.S.C. 154(b) by 339 days.

(21) Appl. No.: 14/129,094

(22) PCT Filed: May 21, 2012

(86) PCT No.: PCT/EP2012/059375
§ 371 (c)(1),
(2), (4) Date: Apr. 3, 2014

(87) PCT Pub. No.: WO2013/000628
PCT Pub. Date: Jan. 3, 2013

(65) Prior Publication Data
US 2015/0022925 A1    Jan. 22, 2015

(30) Foreign Application Priority Data

Jun. 28, 2011 (EP) ..................................... 11171747

(51) Int. Cl.
*G01R 31/00* (2006.01)
*H02H 1/00* (2006.01)
(Continued)

(52) U.S. Cl.
CPC ............ *H02H 1/003* (2013.01); *G01R 31/026* (2013.01); *G01R 31/2818* (2013.01); *H02H 3/28* (2013.01);
(Continued)

(58) Field of Classification Search
CPC ....... H02M 1/00; H01L 21/00; H01L 2221/00; H02J 1/00; G09G 1/00; G09G 2230/00
See application file for complete search history.

(56) References Cited

U.S. PATENT DOCUMENTS 6,529,073 B1 * 3/2003 Highfill, III ............ H03F 1/523
330/207 P
2002/0093360 A1    7/2002 Nagata
(Continued)

FOREIGN PATENT DOCUMENTS

DE        10211099 A1    10/2003
EP        2293446 A1    3/2011

*Primary Examiner* — Jermele M Hollington
*Assistant Examiner* — Temilade Rhodes-Vivour
(74) *Attorney, Agent, or Firm* — McDermott Will & Emery LLP

(57) ABSTRACT

An electronic module (100) has a first and a second circuit (200, 300) with respective first and second output connections (230, 330), respective first and second reference potential connections (220, 320), and respective first and second sensing connections (240, 340), each circuit (200, 300) comprising a respective sensing block (250, 350), which at its input side is connected to the respective sensing connection (240, 340) and to the respective reference potential connection (220, 320). The first sensing connection (240) is either connected to the first output connection (230) or to the second output connection (330). The second sensing connection (340) is connected to the second output connection (330). The sensing blocks (250, 350) are configured to detect a failure of the electronic module (100) with respect to its respective reference potential connection (220, 320) and to indicate a detected failure by providing a failure signal at its respective output connection (230, 330).

21 Claims, 3 Drawing Sheets

Figure 1:
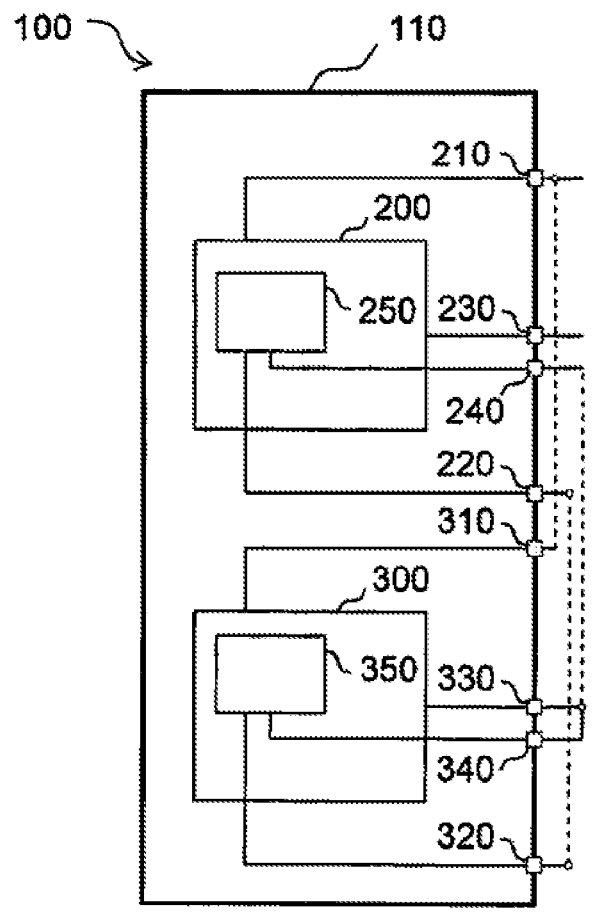

(51) Int. Cl.
*G01R 31/02* (2006.01)
*G01R 31/28* (2006.01)
*H02H 3/28* (2006.01)
H02M 1/00 (2006.01)
H01L 21/00 (2006.01)

(52) U.S. Cl.
CPC ........... *G09G 2230/00* (2013.01); *H01L 21/00* (2013.01); *H02M 1/00* (2013.01)

(56) References Cited

U.S. PATENT DOCUMENTS

| | | | |
|---|---|---|---|
| 2008/0093924 A1 | 4/2008 | Matsumoto et al. | |
| 2009/0116161 A1* | 5/2009 | Takahashi | H03K 17/687 361/100 |
| 2009/0273238 A1* | 11/2009 | Apfel | H02J 1/00 307/31 |
| 2010/0134939 A1* | 6/2010 | Takahashi | H03K 17/0822 361/87 |
| 2010/0164469 A1* | 7/2010 | Bansal | G06F 1/26 323/318 |
| 2010/0177539 A1* | 7/2010 | Lu | H02M 1/00 363/39 |

* cited by examiner

ELECTRONIC MODULE, ELECTRONIC ARRANGEMENT AND METHOD FOR PRODUCING AN ELECTRONIC MODULE

The invention relates to an electronic module, an electronic arrangement with such a module, and to a method for producing an electronic module.

In various electronic modules, there are integrated two or more circuits which provide the same or a similar function. For example, in safety-critical applications, redundant hardware, in particular redundant circuits, may be required to achieve a necessary safety level. To this end, in conventional electronic modules, there may be provided two similar or identical circuits, for example sensor circuits, which each have a separate supply voltage connection, a separate reference potential connection, and a separate output connection. To achieve a desired safety level, each of the circuits may have a failure detection circuit, which observes a voltage level at its respective output connection.

For example, in various electronic modules, during normal operation without failure, a voltage level at the respective output connection is higher than a voltage at the respective reference potential connection. Hence, if the voltage at the reference potential connection becomes higher than the voltage at the output connection, the failure detection circuit may indicate a failure, in particular by providing a predefined voltage at the respective output connection.

However, in some applications, the six respective connections described above may be partially connected together, for example by connecting the supply voltage connections of the two circuits and connecting the reference potential connections of the two circuits. In such a configuration, it may be possible that in case of a failure, in particular a broken ground condition, the signaling of the failure or even a detection of such failure is not possible. This may be based on shifted voltage levels at the output connections due to parasitic paths generated by the failure. As a consequence, a failure detection of such an arrangement may not be reliable.

It is an object of the present invention to provide a more flexible concept for providing an electronic module with a first and a second circuit being able to perform a voltage sensing.

This object is achieved with the subject matter of the present independent claims. Embodiments and developments of the invention are the subject matter of the dependent claims.

In various embodiments, an electronic module has a first circuit and a second circuit, which each are provided with a separate sensing connection for observing a voltage, e.g. in order to detect a failure of the electronic module. Based on a desired configuration, one of the sensing connections is connected to a respective output connection of the circuit, and the sensing connection of the other circuit is alternately connected to an output connection of one of the first and the second circuit. Hence, a reliable sensing can be made possible for different configurations, in particular with respect to the number of different connections to the electronic module. For example, four-wire, five-wire or six-wire applications can be implemented this way, depending on whether the first and the second circuit have separate connections for supply potentials and/or reference potentials.

According to one embodiment, an electronic module comprises a first circuit with a first output connection, a first reference potential connections and a first sensing connection. The first circuit comprises a first sensing block, which at its input side is connected to the first sensing connection and to the first reference potential connection. The electronic module further comprises a second circuit with a second output connection, a second reference potential connection and a second sensing connection. The second circuit comprises a second sensing block, which at its input side is connected to the second sensing connection and to the second reference potential connection. For example, the first and the second circuit are similar or identical regarding their function. However, the first and the second circuit may also provide different functions. The first sensing connection is either connected to the first output connection or to the second output connection, and the second sensing connection is connected to the second output connection.

Accordingly, the second sensing block is able to observe a voltage at the second output connection, whereas the first sensing block is able to observe either a voltage at the first output connection or a voltage at the second output connection. Hence, by not fixedly connecting the first sensing block to the first output connection but via the first sensing connection to either one of the first or the second output connection, the electronic module can flexible be adapted for various connection configurations. For example, a different connection of the first sensing connection can be chosen for the first reference potential connection and the second reference potential connection not being connected together and for these reference potential connections being connected together.

According to one embodiment, the first circuit and the second circuit are arranged isolated from each other. Herein, an isolation of the first and the second circuit is assumed not taking into account a possible connection of the first and the second sensing connection. For example, the first circuit and the second circuit are formed on separate dies. These dies may be arranged isolated from each other, e.g. on a circuit board or stacked on each other, such that a connection between the respective sensing connections and the selected output connections are formed by providing individual connections to the separate dies.

According to one embodiment, at least one of the first circuit and the second circuit comprises a sensor circuit. For example, the one sensor circuit or the two sensor circuits comprise various elements for evaluating signals of one or more sensor elements, wherein an output signal of the respective sensor circuit may be provided at the respective output connection.

According to one embodiment, the first sensing block is configured to detect a failure of the electronic module, in particular a failure with respect to the first reference potential connection, and the second sensing block is configured to detect a failure of the electronic module, in particular a failure with respect to the second reference potential connection. The first and the second reference potential connection may be connected to different ground connections or to the same ground connection. The first and the second sensing blocks may therefore be configured to detect whether such a connection to a ground connection is broken.

According to one implementation form, the first sensing block is configured to indicate a detected failure by providing a failure signal at the first output connection, and the second sensing block is configured to indicate a detected failure by providing a failure signal at the second output connection. For example, the first circuit and the second circuit, in particular the first sensing block and the second sensing block, are provided with a respective supply voltage. A failure may be indicated by providing the failure signal in a low failure band, wherein the signal level of the failure signal is below a predefined percentage of the supply voltage of the respective circuit, for example below 4% of the supply voltage. Alternatively, a failure can be indicated by providing the failure signal in a high failure band, wherein the voltage level of the failure signal is above a predefined percentage of the supply voltage, e.g. above 96% of the supply voltage.

According to some implementation forms, the first sensing block uses a failure signal in the described high failure band, and the second sensing block uses a failure signal in the described low failure band, if a failure is detected, respectively.

According to one embodiment, the first sensing block is configured to compare a voltage at the first sensing connection with a voltage at the first reference potential connection, and the second sensing block is configured to compare a voltage at the second sensing connection with a voltage at the second reference potential connection. For example, each of the first and the second sensing block comprises a comparator in order to perform the comparison. In each of the sensing blocks, a failure may be detected if the voltage at the respective reference potential connection is higher than the voltage at the respective sensing connection. Due to the flexible connection of the first and the second sensing connections, the sensing blocks may observe the same output connection, namely the second output connection, or its respective individual output connection.

According to one embodiment, the first sensing connection and the second sensing connection are commonly connected to the second output connection, and the first reference potential connection is connected to the second reference potential connection. In this configuration, both sensing blocks are able to observe a voltage at the second output connection. When connecting the electronic module to an external circuit, which evaluates a voltage at the second output connection, such external circuit may have an input terminal connected to the second output connection and a reference terminal connected to the first and the second reference potential connection. Furthermore, a pull-down resistor may be connected between the input terminal and the reference terminal. In this case, both sensing blocks observe voltages at a lower output level, in particular if the first output connection is connected to a pull-up resistor further included in the external circuit.

According to one implementation form, the electronic module is arranged in a housing having an external power supply pin, a first external output pin, a second external output pin, and an external reference potential pin. The power supply pin is commonly connected to a first supply connection of the first circuit and the second supply connection of the second circuit. The first output pin is connected to the first output connection. The second output pin is connected to the second output connection, and the reference potential pin is commonly connected to the first reference potential connection and the second reference potential connection.

Accordingly, the housing of the electronic module has four pins in this case, which are connected to the six connections of the electronic module as described. A connection to external circuits is in particular only possible via these four described pins. However, by the common connection of the first and the second sensing connection to the second output connection and the second output pin, respectively, a reliable failure detection, in particular with respect to a broken ground condition, is possible.

According to a further implementation form, the electronic module is arranged in a housing having at least six pins. In particular, the electronic module is arranged in a housing having a first external power supply pin, a second external power supply pin, a first external output pin, a second external output pin, a first external reference potential pin and a second external reference potential pin. The first sensing connection is connected to the first output connection. The first power supply pin is connected to a first supply connection of the first circuit, and the second power supply pin is connected to a second supply connection of the second circuit. The first output pin is connected to the first output connection, and the second output pin is connected to the second output connection. The first reference potential pin is connected to the first reference potential connection, and the second reference potential pin is connected to the second reference potential connection. Hence, in this configuration, the sensing connections of the first and the second circuit are each connected to the respective output connections of the corresponding circuit. Hence, the flexible and selective connection of the first sensing connection allows a configuration for a housing with at least six external pins with little effort.

Regarding the number of external pins of the housing, it should be noted that as well for the four-pin configuration as the six-pin configuration, further external pins may be present in such housing, which, however, may be used for different purposes and in particular are not connected to the connections of the electronic module described above.

In further embodiments, the electronic module is arranged in a housing having at least five pins, wherein a connection of the sensing connections is similar or identical to the embodiments described above. Either the reference potential connections or the supply connections of the first and the second circuit are commonly connected to respective pins of the housing, accordingly.

The first circuit and the second circuit may be arranged on a circuit board, in particular a printed circuit board, e.g. as separate integrated circuits arranged on the circuit board.

According to one embodiment, at least one of the connections to the first sensing connection and the second sensing connection is integrated on the circuit board. For example, a connection of the second sensing connection and the second output connection is integrated on the circuit board.

According to another embodiment, at least one of the connections to the first sensing connection and the second sensing connection is implemented with a wire, which is not integrated on the circuit board. For example, the circuit board has respective terminals, which are electrically connected to the first sensing connection and the second sensing connection, respectively, and to the first output connection and the second output connection, respectively, wherein the connection between these terminals is implemented via wires, e.g. wire bridges. If the circuit board is integrated in a housing, such wires can be formed by bonding wires connecting the terminals on the circuit board to external pins of the housing. If both sensing connections are to be connected together, such connection may be implemented by double bonding of the respective terminals on the circuit board to the same external output pin, e.g. a second output pin.

According to a further embodiment, an electronic arrangement with an electronic module according to one of the implementation forms described above and an electronic control unit is provided. The electronic control unit comprises a supply terminal connected to a supply connection of the first circuit and a reference terminal connected to the second reference potential connection. The electronic control unit further comprises a first input terminal connected to the first output connection and a second input terminal connected to the second output connection. A pull-up resistor is connected between the supply terminal and the first input terminal, and a pull-down resistor is connected between the reference terminal and the second input terminal.

According to the various embodiments of the electronic module described above, the electronic module may comprise a first supply terminal connected to the supply connection of the first circuit and a second supply terminal connected to the supply connection of the second circuit, and further a first reference terminal connected to the first reference potential connection and a second reference terminal connected to the second reference potential connection.

Regardless of the number of separate and individual supply terminals and reference terminals of the electronic control unit, it is possible to sense a voltage at that output connection, which has the lowest voltage level. In particular, in a six-wire configuration, as described above, sensing at the first output connection is independent from the state of the second circuit, and vice-versa. For a four-wire configuration, as described above, a connection of the sensing connection to the second output connection, and therefore to the pull-down resistor, sensing of the lowest voltage level can be achieved.

In various embodiments, the electronic module may comprise more than two circuits, which comprise respective sensing blocks with sensing connections. These sensing connections may accordingly be connected to one of the output connections in the above described manner. The respective circuits may be isolated from each other and may be formed on separate dies, which can be arranged on one or more circuit boards or stacked on each other or a combination thereof.

According to a further embodiment, a method for producing an electronic module is provided. The method comprises providing a first circuit with a first output connection, a first reference potential connection and a first sensing connection, the first circuit comprising a first sensing block, which at is input side is connected to the first sensing connection and to the first reference potential connection. The method further comprises providing a second circuit with a second output connection, a second reference potential connection and a second sensing connection, the second circuit comprising a second sensing block, which at its input side is connected to the second sensing connection and to the second reference potential connection. The first sensing connection is either connected to the first output connection or to the second output connection. The second sensing connection is connected to the second output connection.

According to an embodiment of the method, the first circuit and the second circuit are arranged isolated from each other.

Further embodiments of the method become apparent from the various implementation forms and embodiments described above for the electronic module.

Figure 2:
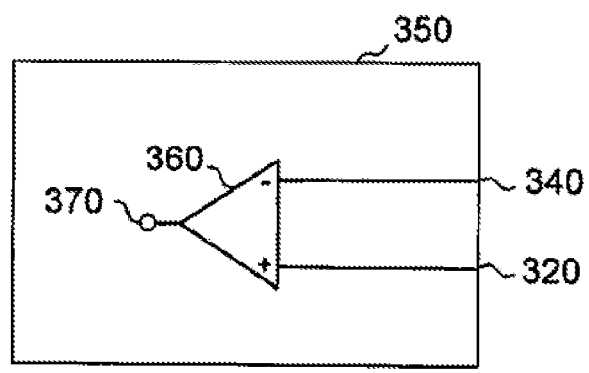
Figure 3:
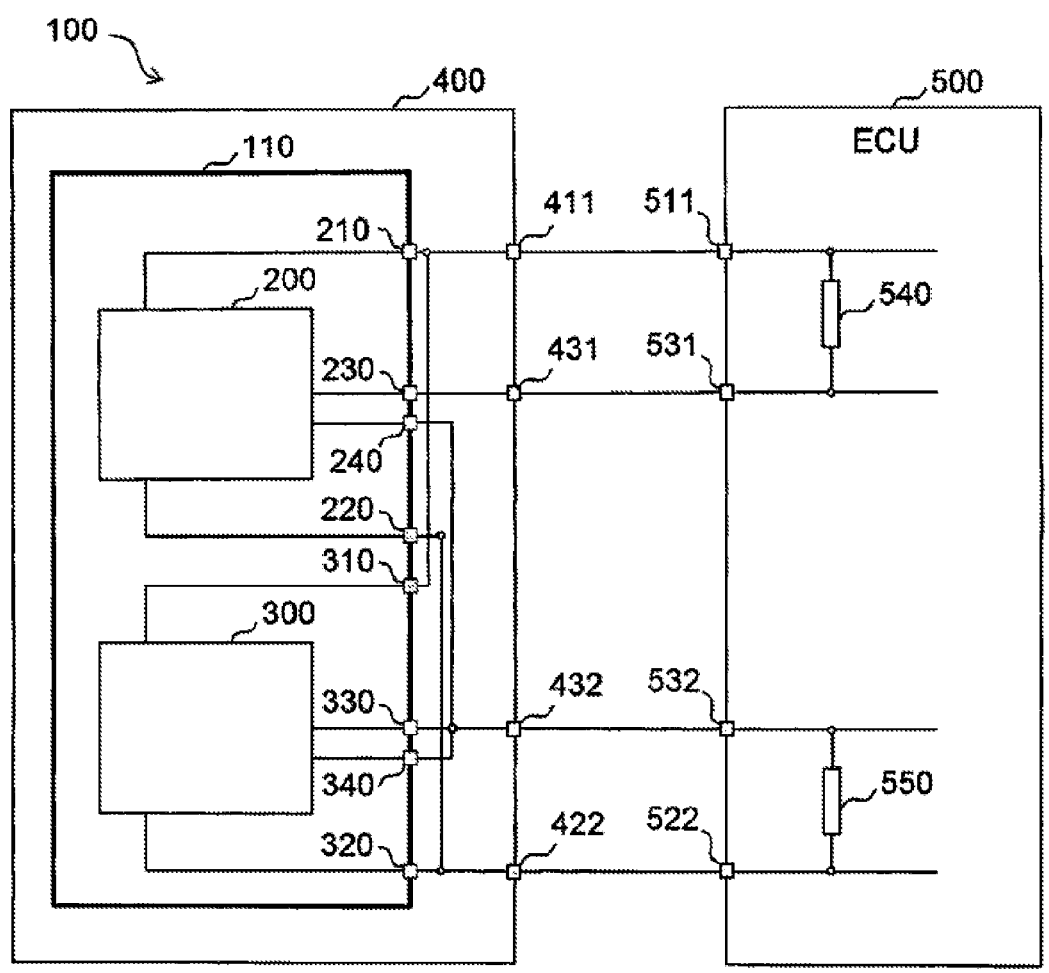
Figure 4:
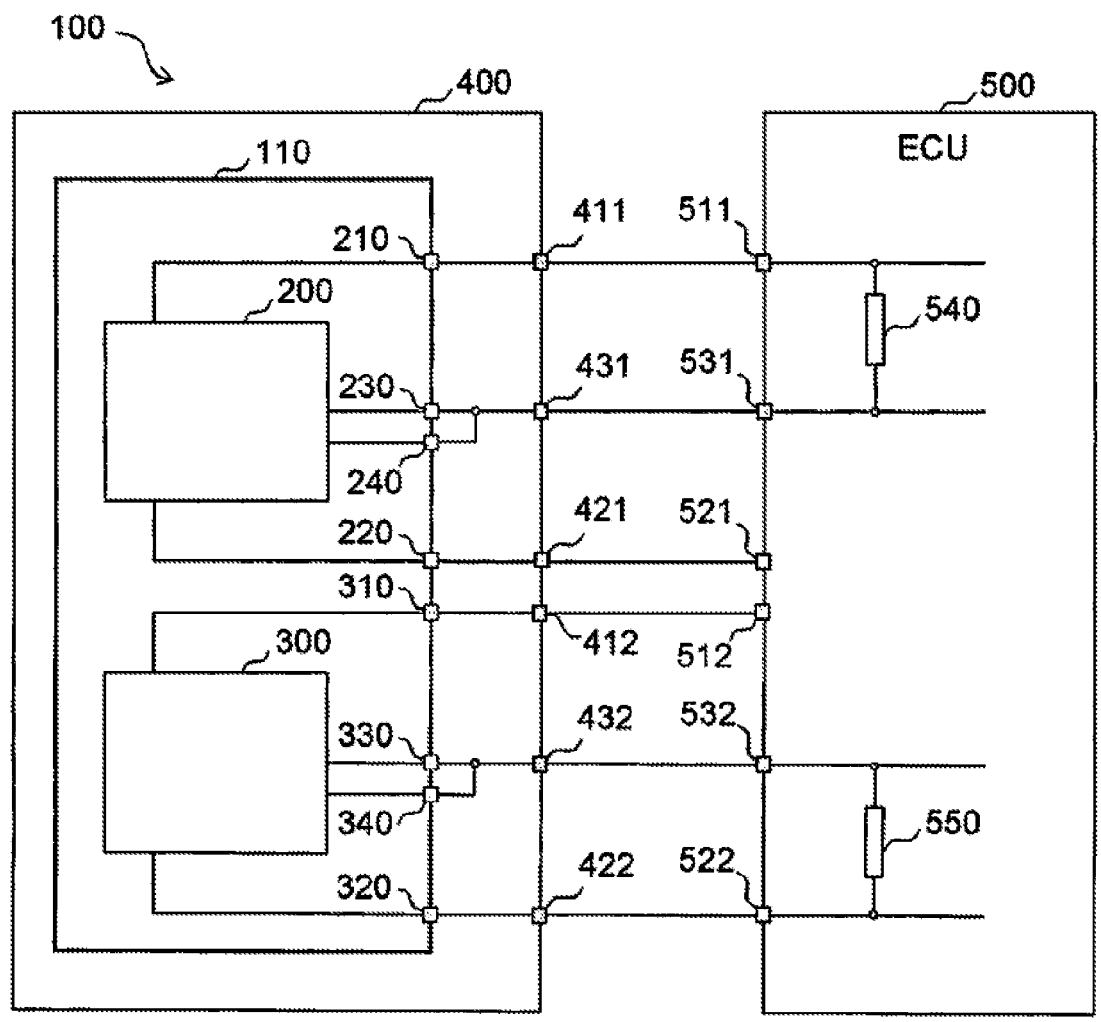

The text below explains the invention in detail using exemplary embodiments with reference to the drawings, in which:

FIG. 1 shows an embodiment of an electronic module,
FIG. 2 shows an embodiment of a sensing block,
FIG. 3 shows a first embodiment of an electronic arrangement, and
FIG. 4 shows a second embodiment of an electronic arrangement.

FIG. 1 shows an embodiment of an electronic module 100 with a circuit board 110, on which a first circuit 200 and a second circuit 300 are arranged. The first circuit 200 comprises a first supply connection 210, a first reference potential connection 220, a first output connection 230, a first sensing connection 240, and a first sensing block 250. In a similar fashion, the second circuit 300 comprises a second supply connection 310, a second reference potential connection 320, a second output connection 330, a second sensing connection 340, and a second sensing block 350. The first and the second circuit 200, 300 may also be arranged stacked on each other. For example, the first circuit 200 and the second circuit 300 are formed on separate dies. These dies may be arranged isolated from each other, with or without a circuit board.

The first sensing block 250 is on its input side connected to the first reference potential connection 220 and to the first sensing connection 240. Similarly, the second sensing block 350 is on its input side connected to the second reference potential connection 320 and to the second sensing connection 340. In this embodiment, the second sensing connection 340 is fixedly connected to the second output connection 330. In various embodiments, the first and the second reference potential connection 220, 320 may be connected together, indicated by a dashed line. Furthermore, the first and the second supply connection 210, 310 may be connected together, also indicated by a dashed line. The first sensing connection 240 may be connected to the second sensing connection 340 and the second output connection 330, respectively, as indicated by a dashed line, or alternatively with the first output connection 230.

The first and the second circuit 200, 300 may be of the same function and/or the same circuit layout in order to provide a redundant configuration of the module 100. This may be desirable in particular for safety-critical applications. However, the first and the second circuit 200, 300 may also provide different functions. The first and the second circuit 200, 300 each may comprise a sensor circuit for evaluating or processing a signal of a sensor element. The first and the second circuit 200, 300 may be arranged isolated from each other on the circuit board 110, such that the only electrical connection between the first and the second circuit 200, 300 may consist of the above-described connections of the connections 210, 220, 230, 240, 310, 320, 330, 340. Each of the sensing blocks 250, 350 may be configured to detect a failure of the electronic module 100, in particular a failure with respect to the corresponding reference potential connection 220, 320 of the respective circuit 200, 300. If a failure is detected by one of the sensing blocks 250, 350, a respective failure signal may be provided at the corresponding output connection 230, 330 of the respective circuit 200, 300.

FIG. 2 shows an exemplary embodiment of a sensing block 350, wherein the sensing block 250 may be implemented similarly or identically. The sensing block 350 comprises a comparator 360, which at its inverting input is connected to the second sensing connection 340 and at its non-inverting input is connected to the second reference potential connection 320. An output 370 of the comparator 360 hence provides a comparison result whether a voltage at the second sensing connection 340 is greater than a voltage at the second reference potential connection 320. In particular, during normal operation of the electronic module, the voltage at the second output connection 340 is greater than the voltage at the second reference potential connection 320.

If a failure exists in the electronic module, in particular with respect to a broken ground condition of the second reference potential connection 320, the voltage at the second reference potential connection 320 may become greater than the voltage at the second output connection 340, which can be sensed by the comparator 360. In this case, a failure signal may be provided at the second output connection 330, e.g. by providing a distinct failure signal having a predefined voltage level. For example, a failure signal of a low failure band can be provided, such that a voltage is provided at the second output connection 330, which is lower than e.g. 4% of the supply voltage provided at the second supply connection 310.

The failure signal may also be provided in a high failure band, such that an output voltage at the second output connection 330 is greater than e.g. 96% of the supply voltage. A similar failure detection and failure signaling may be performed by the first circuit 200 and the first sensing block 250, respectively. For example, in case of a failure, the first sensing block is adapted to provide a failure signal in the high failure band and the second circuit 300 and the second sensing block 350, respectively, is adapted to provide a failure signal in the low failure band.

The electronic module 100 described in FIG. 1 can be adapted with little effort to different configurations regarding the number of signal lines connecting to an external circuit or module.

FIG. 3 shows an exemplary embodiment of an electronic arrangement with an electronic module 100 connected to an electronic control unit 500 in a four-wire configuration. In this embodiment, the electronic module 100 is arranged in a housing 400 having a single power supply pin 411, a single reference potential pin 422 and a first and a second output pin 431, 432. The power supply pin 411 is commonly connected to the first and the second supply connection 210, 310, the reference potential pin 422 is commonly connected to the first and the second reference potential connection 220, 320. The first output pin 431 is connected to the first output connection 230 and the second output pin 432 is connected to the second output connection 330. The pins 411, 422, 431, 432 are external pins of the housing 400, such that a connection to the internal connections of the first and the second circuit 200, 300 on the circuit board 110 is only possible via these external pins. Internally, the first and the second sensing connection 240, 340 are commonly connected to the second output connection 330, such that the respective sensing blocks 250, 350 both sense a voltage at the second output connection 330.

The electronic control unit 500 comprises a supply terminal 511, a reference terminal 522, and a first and a second input terminal 531, 532. The supply terminal 511 is connected to the power supply pin 411, the reference terminal 522 is connected to the reference potential pin 422, the first input terminal 531 is connected to the first output pin 431, and the second input terminal 532 is connected to the second output pin 432. A pull-up resistor 540 is connected between the supply terminal 511 and the first input terminal 531, and a pull-down resistor 550 is connected between the reference terminal 522 and the second input terminal 532.

In particular, the electronic control unit 500 provides a supply voltage at the supply terminal 511 and a reference potential or a ground voltage at the reference terminal 522. With this configuration, it is assumed that because of the pull-down resistor 550, the lowest output voltage of the electronic module 100 is present at the second output connection 330 and the second output pin 432, respectively. Accordingly, as both the first and the second circuit 200, 300 sense this lowest voltage at their respective sensing connections 240, 340, a reliable failure detection is made possible in both circuits 200, 300, enabling a reliable signaling of a failure situation, in particular a broken ground condition of the electronic module 100. Only four wires or signal lines are needed to connect the electronic module to the electronic control unit 500.

FIG. 4 shows another embodiment of an electronic arrangement with an electronic module 100 according to FIG. 1 and an electronic control unit 500. The electronic arrangement of FIG. 4 shows a six-wire configuration, such that in particular with respect to FIG. 3, two additional signal wires are present.

Similar to FIG. 3, the electronic module 100 is arranged in a housing 400 having a first external power supply pin 411 connected to the first supply connection 210, a second power supply pin 412 connected to the second supply pin 310, a first reference potential pin 421 connected to the first reference potential connection 220, a second reference potential pin 422 connected to the second reference potential connection 320, a first output pin 431 connected to the first output connection 230, and a second output pin 432 connected to the second output connection 330. The pins 411, 412, 421, 422, 431, 432 are external pins of the housing 400.

Additional to the terminals of the electronic control unit 500 described in conjunction with FIG. 3, the electronic control unit 500 of FIG. 4 has separate supply pins 511, 512, which are independently connected to the first and the second supply pin 411, 412. In a similar fashion, the electronic control unit 500 has separate reference terminals 521, 522, which are independently connected to the first and the second reference potential pins 421, 422.

Internally of the module 100, the first sensing connection 240 is connected to the first output connection 230 and the second sensing connection 340 is connected to the second output connection 330. In particular, there is no electrical connection between the first circuit 200 and the second circuit 300 on the circuit board 110 or in the housing 400. Accordingly, the first circuit 200 and the first sensing block 250 sense a voltage at the first output connection 230, whereas the second circuit 300 and the second sensing block 350 sense a voltage at the second output connection 330. As the first and the second circuit 200, 300 are electrically independent from each other, even in a failure situation, each of the circuits is able to perform a reliable detection of a failure situation, in particular a broken ground condition, and to signal such failure at the first and the second output connection 230, 330, respectively.

With respect to the different embodiments of FIG. 3 and FIG. 4, it can be seen that the electronic module 100 can be easily adapted for applications having either a four-wire configuration or a six-wire configuration, the adaptation of the electronic module 100 needing little effort. Furthermore, five-wire configurations may be implemented, wherein either a supply connection or a reference potential connection is shared. In particular, the first and the second circuit 200, 300, which may be identical to provide a redundant configuration, may be wired in one of the last production stages to fulfill the requirements of the desired configuration. The wiring, in particular of the sensing connections 240, 340, may be implemented on the circuit board 110 or by additional wires or bridges attached to the circuit board. Furthermore, it is possible to perform the connections by providing bonding wires from the external pins of the housing 400 to the internal connections of the circuit board 110 or the first and the second circuit 200, 300. The provision of the additional sensing connection 240, 340 needs little space when integrating the first and the second circuit on a semiconductor die. Hence, a greater flexibility can be achieved with little effort.

In various embodiments, the electronic module 100 may comprise more than two circuits, which comprise respective sensing blocks with sensing connections. These sensing connections may accordingly be connected to one of the output connections in the above described manner.

The invention claimed is:

1. An electronic module, comprising:
   a first circuit with a first output connection, a first reference potential connection and a first sensing connection, the first circuit comprising a first sensing block, which at its input side is connected to the first sensing connection and to the first reference potential connection; and
   a second circuit with a second output connection, a second reference potential connection and a second sensing connection, the second circuit comprising a second sensing block, which at its input side is connected to the second sensing connection and to the second reference potential connection,
wherein
   the first sensing connection is either connected to the first output connection or to the second output connection,
   the second sensing connection is connected to the second output connection,
   the first sensing block is configured to detect a failure of the electronic module with respect to the first reference potential connection and to indicate a detected failure by providing a first failure signal at the first output connection, wherein a voltage level of the first failure signal is above a first predefined percentage of a supply voltage of the first sensing block, and
   the second sensing block is configured to detect a failure of the electronic module with respect to the second reference potential connection and to indicate a detected failure by providing a second failure signal at the second output connection, wherein a voltage level of the second failure signal is below a second predefined percentage of a supply voltage of the second sensing block.

2. The electronic module according to claim 1, wherein the first circuit and the second circuit are arranged isolated from each other, not taking into account a possible connection of the first and the second sensing connection.

3. The electronic module according to claim 1, wherein the first sensing block is configured to compare a voltage at the first sensing connection with a voltage at the first reference potential connection, and
   wherein the second sensing block is configured to compare a voltage at the second sensing connection with a voltage at the second reference potential connection.

4. The electronic module according to claim 1, wherein the first sensing connection and the second sensing connection are commonly connected to the second output connection, and
   wherein the first reference potential connection is connected to the second reference potential connection.

5. The electronic module according to claim 4, wherein the electronic module is arranged in a housing having a single external power supply pin, a first external output pin, a second external output pin and a single external reference potential pin,
   the power supply pin is commonly connected to a first supply connection of the first circuit and a second supply connection of the second circuit,
   the first output pin is connected to the first output connection,
   the second output pin is connected to the second output connection, and
   the reference potential pin is commonly connected to the first reference potential connection and the second reference potential connection.

6. The electronic module according to claim 1, wherein the electronic module is arranged in a housing having a first external power supply pin, a second external power supply pin, a first external output pin, a second external output pin, a first external reference potential pin and a second external reference potential pin,
   the first sensing connection is connected to the first output connection,
   the first power supply pin is connected to a first supply connection of the first circuit,
   the second power supply pin is connected to a second supply connection of the second circuit,
   the first output pin is connected to the first output connection,
   the second output pin is connected to the second output connection,
   the first reference potential pin is connected to the first reference potential connection, and
   the second reference potential pin is connected to the second reference potential connection.

7. The electronic module according to claim 1, wherein the first circuit and the second circuit are arranged on a circuit board, in particular a printed circuit board, and
   wherein at least one of the connections to the first sensing connection and the second sensing connection is integrated on the circuit board.

8. The electronic module according to claim 1, wherein the first circuit and the second circuit are arranged on a circuit board, in particular a printed circuit board, and
   wherein at least one of the connections to the first sensing connection and the second sensing connection is implemented with a wire, which is not integrated on the circuit board.

9. The electronic module according to claim 1, wherein the first circuit and the second circuit are formed on separate dies.

10. The electronic module according to claim 1, wherein at least one of the first circuit and the second circuit comprises a sensor circuit.

11. An electronic arrangement with an electronic module according to claim 1 and an electronic control unit, the electronic control unit comprising:
    a supply terminal connected to a supply connection of the first circuit;
    a reference terminal connected to the second reference potential connection;
    a first input terminal connected to the first output connection;
    a second input terminal connected to the second output connection;
    a pull-up resistor connected between the supply terminal and the first input terminal; and
    a pull-down resistor connected between the reference terminal and the second input terminal.

12. The electronic module according to claim 1, wherein the first sensing block has respective direct electrical connections to the first sensing connection and to the first reference potential connection, and the second sensing block has respective direct electrical connections to the second sensing connection and to the second reference potential connection.

13. The electronic module according to claim 1, wherein
the first sensing block is configured to detect a failure with respect to the first reference potential connection by comparing a voltage at the first sensing connection with a voltage at the first reference potential connection and, if the voltage at the first reference potential connection is higher than the voltage at the first sensing connection, to indicate a detected failure by providing the first failure signal, and
the second sensing block is configured to detect a failure with respect to the second reference potential connection by comparing a voltage at the second sensing connection with a voltage at the second reference potential connection and, if the voltage at the second reference potential connection is higher than the voltage at the second sensing connection, to indicate a detected failure by providing the second failure signal.

14. A method for producing an electronic module, the method comprising:
providing a first circuit with a first output connection, a first reference potential connection and a first sensing connection, the first circuit comprising a first sensing block, which at its input side is connected to the first sensing connection and to the first reference potential connection;
providing a second circuit with a second output connection, a second reference potential connection and a second sensing connection, the second circuit comprising a second sensing block, which at its input side is connected to the second sensing connection and to the second reference potential connection;
connecting the first sensing connection either to the first output connection or to the second output connection; and
connecting the second sensing connection to the second output connection, wherein
the first sensing block is configured to detect a failure with respect to the first reference potential connection and to indicate a detected failure by providing a first failure signal at the first output connection, wherein a voltage level of the first failure signal is above a first predefined percentage of a supply voltage of the first sensing block, and
the second sensing block is configured to detect a failure with respect to the second reference potential connection and to indicate a detected failure by providing a second failure signal at the second output connection, wherein a voltage level of the second failure signal is below a second predefined percentage of a supply voltage of the second sensing block.

15. The method according to claim 14, wherein the first circuit and the second circuit are arranged isolated from each other, not taking into account a possible connection of the first and the second sensing connection.

16. The method according to claim 14, wherein
the electronic module is arranged in a housing having at least one external power supply pin, a first external output pin, a second external output pin and at least one external reference potential pin,
the first output pin is connected to the first output connection,
the second output pin is connected to the second output connection,
if the housing has two external reference potential pins, the first sensing connection is connected to the first output connection, and
if the housing has a single external reference potential pin, the first sensing connection is connected to the second output connection and the single external reference potential pin is commonly connected to the first reference potential connection and the second reference potential connection.

17. The method according to claim 16, wherein, if the housing has a single external power supply pin and a single external reference potential pin, the single power supply pin is commonly connected to a first supply connection of the first circuit and a second supply connection of the second circuit.

18. The method according to claim 14, wherein
the first sensing block is configured to detect a failure with respect to the first reference potential connection by comparing a voltage at the first sensing connection with a voltage at the first reference potential connection and, if the voltage at the first reference potential connection is higher than the voltage at the first sensing connection, to indicate a detected failure by providing the first failure signal,
the second sensing block is configured to detect a failure with respect to the second reference potential connection by comparing a voltage at the second sensing connection with a voltage at the second reference potential connection and, if the voltage at the second reference potential connection is higher than the voltage at the second sensing connection, to indicate a detected failure by providing the second failure signal.

19. The method according to claim 14, wherein the first circuit and the second circuit are formed on separate dies.

20. The method according to claim 14, wherein at least one of the first circuit and the second circuit comprises a sensor circuit.

21. The method according to claim 14, wherein the first sensing block is provided with respective direct electrical connections to the first sensing connection and to the first reference potential connection, and the second sensing block is provided with respective direct electrical connections to the second sensing connection and to the second reference potential connection.

* * * * *